(12) United States Patent
Na et al.

(10) Patent No.: US 8,293,599 B2
(45) Date of Patent: Oct. 23, 2012

(54) METHODS OF FORMING SEMICONDUCTOR DEVICES HAVING GATES WITH DIFFERENT WORK FUNCTIONS USING SELECTIVE INJECTION OF DIFFUSION INHIBITING MATERIALS

(75) Inventors: Hoon-joo Na, Gyeonggi-do (KR); Yu-gyun Shin, Gyeonggi-do (KR); Hong-bae Park, Seoul (KR); Hag-ju Cho, Gyeonggi-do (KR); Sug-hun Hong, Gyeonggi-do (KR); Sang-jin Hyun, Gyeonggi-do (KR); Hyung-seok Hong, Seoul (KR)

(73) Assignee: Samsung Electronics Co., Ltd. (KR)

( * ) Notice: Subject to any disclaimer, the term of this patent is extended or adjusted under 35 U.S.C. 154(b) by 164 days.

(21) Appl. No.: 12/540,090

(22) Filed: Aug. 12, 2009

(65) Prior Publication Data

US 2010/0124805 A1    May 20, 2010

(30) Foreign Application Priority Data

Nov. 19, 2008  (KR) .................. 10-2008-0115328

(51) Int. Cl.
*H01L 21/8238* (2006.01)
(52) U.S. Cl. .................. 438/216; 438/194; 438/217
(58) Field of Classification Search .................. 438/216, 438/217, 194
See application file for complete search history.

(56) References Cited

U.S. PATENT DOCUMENTS

| | | | |
|---|---|---|---|
| 6,274,467 B1* | 8/2001 | Gambino et al. | 438/563 |
| 6,821,833 B1 | 11/2004 | Chou et al. | |
| 6,828,185 B2* | 12/2004 | Lim et al. | 438/216 |
| 7,098,120 B2* | 8/2006 | Saito et al. | 438/527 |
| 7,297,586 B2* | 11/2007 | Triyoso et al. | 438/216 |
| 7,381,619 B2* | 6/2008 | Wang et al. | 438/275 |
| 7,807,522 B2* | 10/2010 | Alshareef et al. | 438/176 |
| 7,807,990 B2* | 10/2010 | Koyama et al. | 257/24 |
| 2009/0286387 A1* | 11/2009 | Gilmer et al. | 438/592 |

FOREIGN PATENT DOCUMENTS

| | | |
|---|---|---|
| JP | 2004-288886 A | 10/2004 |
| KR | 1020030037347 A | 5/2003 |

* cited by examiner

*Primary Examiner* — Kimberly Rizkallah
*Assistant Examiner* — Caleb Henry
(74) *Attorney, Agent, or Firm* — Myers Bigel Sibley & Sajovec, P.A.

(57) ABSTRACT

A semiconductor device that has a dual gate having different work functions is simply formed by using a selective nitridation. A gate insulating layer is formed on a semiconductor substrate including a first region and a second region, on which devices having different threshold voltages are to be formed. A diffusion inhibiting material is selectively injected into the gate insulating layer in one of the first region and the second region. A diffusion layer is formed on the gate insulating layer. A work function controlling material is directly diffused from the diffusion layer to the gate insulating layer using a heat treatment, wherein the gate insulting layer is self-aligned capped with the selectively injected diffusion inhibiting material so that the work function controlling material is diffused into the other of the first region and the second region. The gate insulating layer is entirely exposed by removing the diffusion layer. A gate electrode layer is formed on the exposed gate insulating layer. A first gate and a second gate having different work functions are respectively formed in the first region and the second region by etching the gate electrode layer and the gate insulating layer.

18 Claims, 6 Drawing Sheets

US 8,293,599 B2

METHODS OF FORMING SEMICONDUCTOR DEVICES HAVING GATES WITH DIFFERENT WORK FUNCTIONS USING SELECTIVE INJECTION OF DIFFUSION INHIBITING MATERIALS

CROSS-REFERENCE TO RELATED APPLICATIONS

This application claims the benefit of Korean Patent Application No. 10-2008-0115328, filed on Nov. 19, 2008, in the Korean Intellectual Property Office, the disclosure of which is incorporated herein in its entirety.

FIELD OF THE INVENTION

The inventive concept relates to a method of fabricating a semiconductor device, and more particularly, to a semiconductor device having gates with different work functions.

BACKGROUND

In general, gate structures of transistors include a gate insulating layer arranged on a semiconductor substrate and a gate arranged on the gate insulating layer. The gate insulating layer may be a silicon oxide layer, and the gate may be a polysilicon layer. However, a reduction in the size of semiconductor devices can result in a reduction in the thickness of the gate insulating layer and a reduction in the line width of the gate.

SUMMARY

The inventive concept can provide a method of fabricating a semiconductor device having a dual gate by which gates of a PMOS transistor and an NMOS transistor including a high dielectric constant gate insulating layer and a metal gate electrode layer are simply formed and a work function of the gates is easily controlled.

According to an aspect of the inventive concept, there is provided a method of fabricating a semiconductor device having a dual gate. A gate insulating layer is formed on a semiconductor substrate including a first region and a second region, on which devices having different threshold voltages are to be formed. A diffusion inhibiting material is selectively injected into the gate insulting layer in one of the first region. A diffusion layer is formed on the gate insulating layer. A work function controlling material is directly diffused from the diffusion layer to the gate insulating layer using a heat treatment. The gate insulting layer is self-aligned capped with the selectively injected diffusion inhibiting material so that the work function controlling material is diffused into the other of the first region and the second region. The gate insulating layer is entirely exposed by removing the diffusion layer. A gate electrode layer is formed on the exposed gate insulating layer. A first gate and a second gate having different work functions are respectively formed in the first region and the second region by etching the gate electrode layer and the gate insulating layer.

The gate insulating layer may include one selected from a group consisting of $HfSiO_2$, HfSiO, HfSiON, HfON, HfAlO, HfLaO, and $La_2O_3$.

The injection of the diffusion inhibiting material may be selectively performed by injecting nitrogen into the one of the first region and the second region of the gate insulating layer using plasma nitridation or an implant process.

The gate electrode layer may include one selected from a group consisting of WN, TiN, TaN, and TiAlN.

The first gate formed in the first region may include a gate of a PMOS transistor, and the second gate formed in the second region may include a gate of an NMOS transistor.

The injection of the diffusion inhibiting material may include an injection of nitrogen into the second region. The diffusion layer may include AlO.

The injection of the diffusion inhibiting material may include an injection of nitrogen into the first region. The diffusion layer may include one selected from the group consisting of LaO, DyO, and YO.

Nitrogen may further be injected into the exposed gate insulating layer by performing plasma nitridation before the forming a gate electrode layer after removing the diffusion layer.

BRIEF DESCRIPTION OF THE DRAWINGS

Exemplary embodiments of the inventive concept will be more clearly understood from the following detailed description taken in conjunction with the accompanying drawings in which.

DETAILED DESCRIPTION OF THE EMBODIMENTS

Figure 1A:
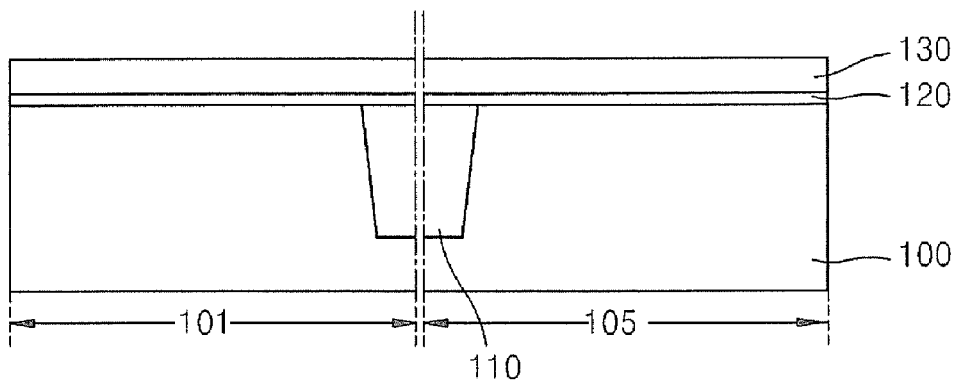
FIGS. 1A through 1H are cross-sectional views for illustrating a method of fabricating a semiconductor device, according to an embodiment of the inventive concept.

The present inventive concept now will be described more fully hereinafter with reference to the accompanying drawings, in which embodiments of the inventive concept are shown. However, this inventive concept should not be construed as limited to the embodiments set forth herein. Rather, these embodiments are provided so that this disclosure will be thorough and complete, and will fully convey the scope of the inventive concept to those skilled in the art. In the drawings, the thickness of layers and regions may be exaggerated for clarity. Like numbers refer to like elements throughout. As used herein the term "and/or" includes any and all combinations of one or more of the associated listed items and may be abbreviated as "/".

The terminology used herein is for the purpose of describing particular embodiments only and is not intended to be limiting of the inventive concept. As used herein, the singular forms "a," "an" and "the" are intended to include the plural forms as well, unless the context clearly indicates otherwise. It will be further understood that the terms "comprises," "comprising," "having," "having," "includes," and/or "including" when used in this specification, specify the presence of stated features, regions, steps, operations, elements, and/or components, but do not preclude the presence or addition of one or more other features, regions, steps, operations, elements, components, and/or groups thereof.

It will be understood that when an element such as a layer or region is referred to as being "on" or extending "onto" another element (or variations thereof), it can be directly on or extend directly onto the other element or intervening elements may also be present. In contrast, when an element is referred to as being "directly on" or extending "directly onto" another element (or variations thereof), there are no intervening elements present. It will also be understood that when an element is referred to as being "connected" or "coupled" to another element (or variations thereof), it can be directly connected or coupled to the other element or intervening elements may be present. In contrast, when an element is referred to as being "directly connected" or "directly coupled" to another element (or variations thereof), there are no intervening elements present.

It will be understood that, although the terms first, second, etc. may be used herein to describe various elements, components, regions, layers and/or sections, these elements, materials, regions, layers and/or sections should not be limited by these terms. These terms are only used to distinguish one element, material, region, layer or section from another element, material, region, layer or section. Thus, a first element, material, region, layer or section discussed below could be termed a second element, material, region, layer or section without departing from the teachings of the present inventive concept.

Relative terms, such as "lower", "back", and "upper" may be used herein to describe one element's relationship to another element as illustrated in the Figures. It will be understood that relative terms are intended to encompass different orientations of the device in addition to the orientation depicted in the Figures. The exemplary term "upper", can therefore, encompasses both an orientation of "lower" and "upper," depending on the particular orientation of the figure. Similarly, if the structure in one of the figures is turned over, elements described as "below" or "beneath" other elements would then be oriented "above" the other elements. The exemplary terms "below" or "beneath" can, therefore, encompass both an orientation of above and below.

Embodiments of the present inventive concept are described herein with reference to cross section and perspective illustrations that are schematic illustrations of idealized embodiments of the present inventive concept. As such, variations from the shapes of the illustrations as a result, for example, of manufacturing techniques and/or tolerances, are to be expected. Thus, embodiments of the present inventive concept should not be construed as limited to the particular shapes of regions illustrated herein but are to include deviations in shapes that result, for example, from manufacturing. For example, a region illustrated or described as flat may, typically, have rough and/or nonlinear features. Moreover, sharp angles that are illustrated, typically, may be rounded. Thus, the regions illustrated in the figures are schematic in nature and their shapes are not intended to illustrate the precise shape of a region and are not intended to limit the scope of the present inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

As used herein, the term "dual gate" is used to refer to arrangements where at least two different gates of different transistor devices are formed on a gate insulating layer having different work function a different locations therein.

FIGS. 1A through 1H are cross-sectional views for describing a method of fabricating a semiconductor device, according to an embodiment of the inventive concept. Referring to FIG. 1A, a semiconductor substrate 100 may include a PMOS region 101 in which a PMOS transistor is arranged and an NMOS region 105 in which an NMOS transistor is arranged. The PMOS region 101 and the NMOS region 105 are defined by an isolation film 110. Even though not illustrated herein, in the semiconductor substrate 100, a p-type well may be arranged in the PMOS region 101, and an n-type well may be arranged in the NMOS region 105.

An interface layer 120 is formed on the semiconductor substrate 100, and a gate insulating layer 130 is formed on the interface layer 120. The gate insulating layer 130 may include an insulating layer having a high dielectric constant. The interface layer interfaces between the semiconductor substrate 100 and the gate insulating layer 130 having a high dielectric constant, and may include a silicon oxide layer. The gate insulating layer 130 may include one selected from a group consisting of $HfSiO_2$, HfSiO, HfSiON, HfON, HfAlO, HfLaO, and $La_2O_3$.

Figure 1B:
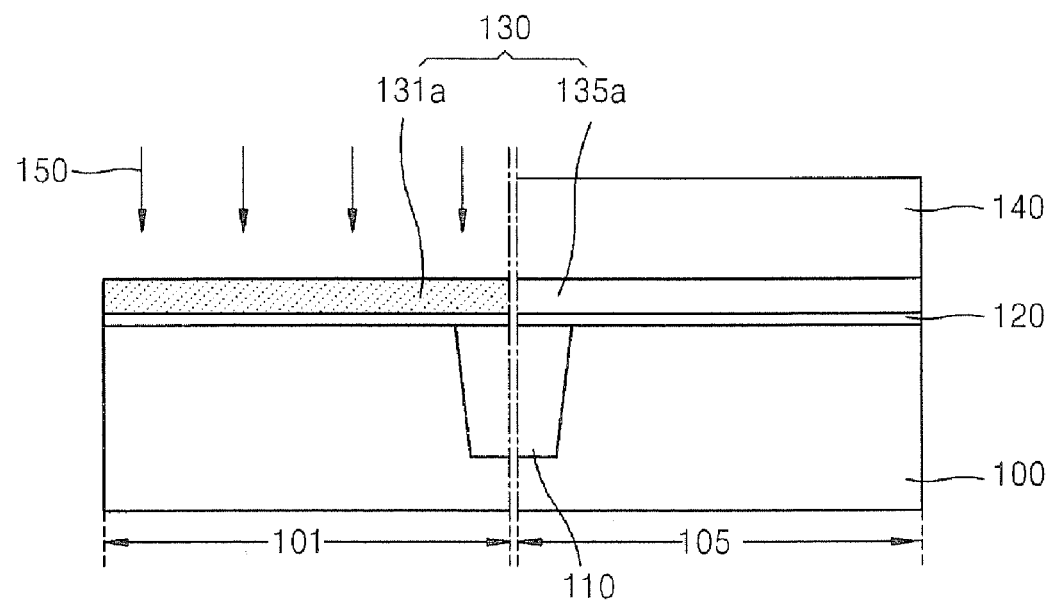

Referring to FIG. 1B, a photosensitive layer 140 is formed on the gate insulating layer 130. The photosensitive layer 140 may be formed such that a portion of the gate insulating layer 130 corresponding to at least one of the PMOS region 101 and the NMOS region 105 is exposed. The photosensitive layer 140 may be arranged on a second region 135a of the gate insulating layer 130 corresponding to the NMOS region 105 to expose a first region 131a of the gate insulating layer 130 corresponding to the PMOS region 101.

Nitrogen 150 is injected into the exposed first region 131a of the gate insulating layer 130 using the photosensitive layer 140 as a mask. The nitrogen 150 can inhibit a work function controlling material from being diffused from a diffusion layer 160 of FIG. 1C to the gate insulating layer 130 during subsequent processes. The nitrogen 150 may be injected into the exposed first region 131a of the gate insulating layer 130 using plasma nitridation or an implant process.

Figure 1C:
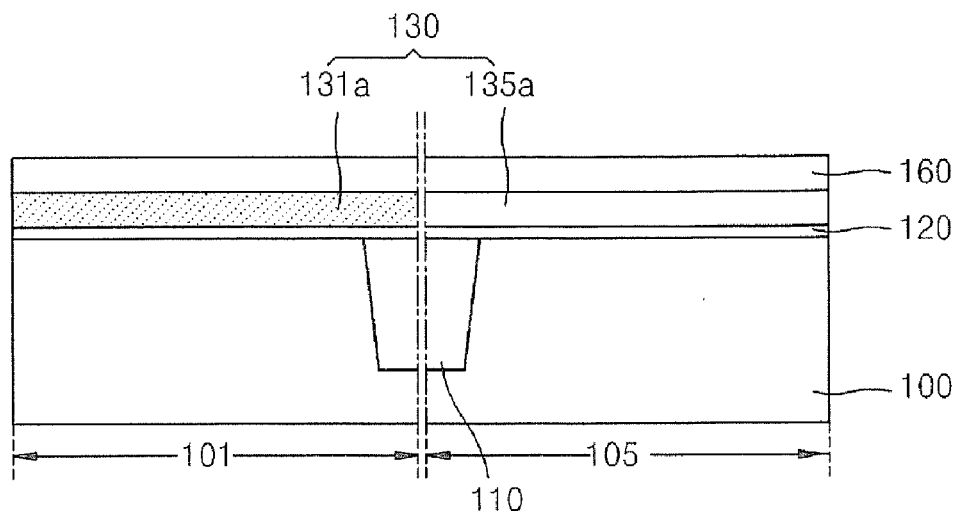

Referring to FIG. 1C, the photosensitive layer 140 is removed. Then, the diffusion layer 160 is formed on the gate insulating layer 130. The diffusion layer 160 may include one selected from a group consisting of LaO, DyO, and YO. The diffusion layer 160 controls or reduces a work function of a gate of the NMOS transistor which will be formed in the NMOS region 105.

Figure 1D:
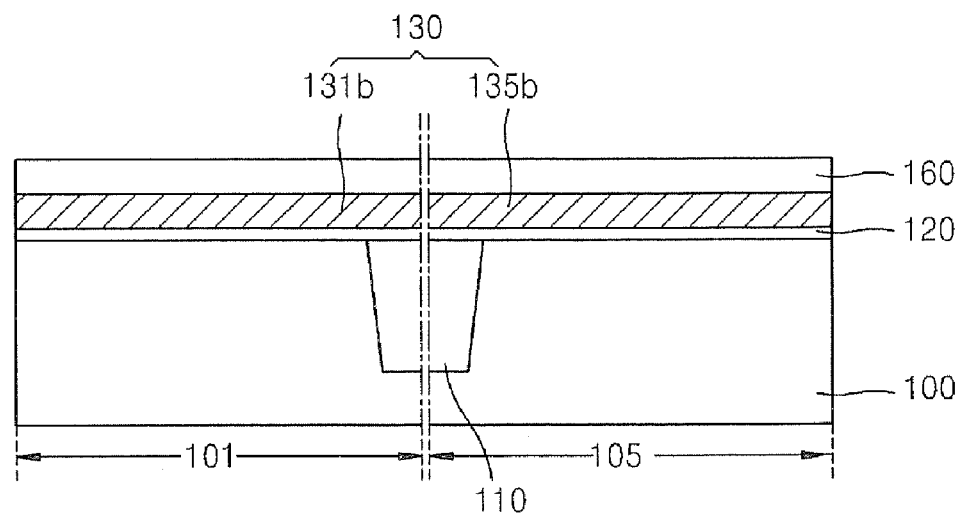

Referring to FIG. 1D, a heat treatment is performed. A work function controlling material, such as aluminum or oxygen, is diffused from the diffusion layer 160 to the gate insulating layer 130. The nitrogen 150 injected into the first region 131b, as shown in FIG. 1B, may inhibit or block the work function controlling material from being diffused from the diffusion layer 160 to the first region 131b of the gate insulating layer 130. Meanwhile, since the nitrogen 150 is not injected into the second region 135b of the gate insulating layer 130 (i.e., the region exposed by the photosensitive layer 140), the work function controlling material is diffused from the diffusion layer 160 to the second region 135b of the gate insulating layer 130. Thus, the gate insulating layer 130 is self-aligned capped by the injected nitrogen 150 to selectively inject the work function controlling material thereinto. In other words, the portions of the gate insulating layer 130 having the different work functions can be self-aligned by the blocking effect of the nitrogen injected into the gate insulating layer 130.

Figure 1E:
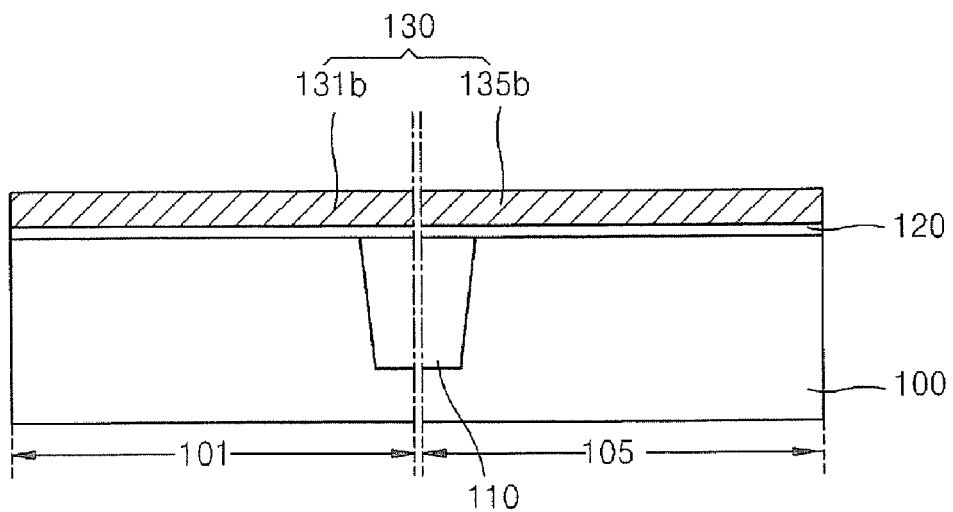
Figure 1F:
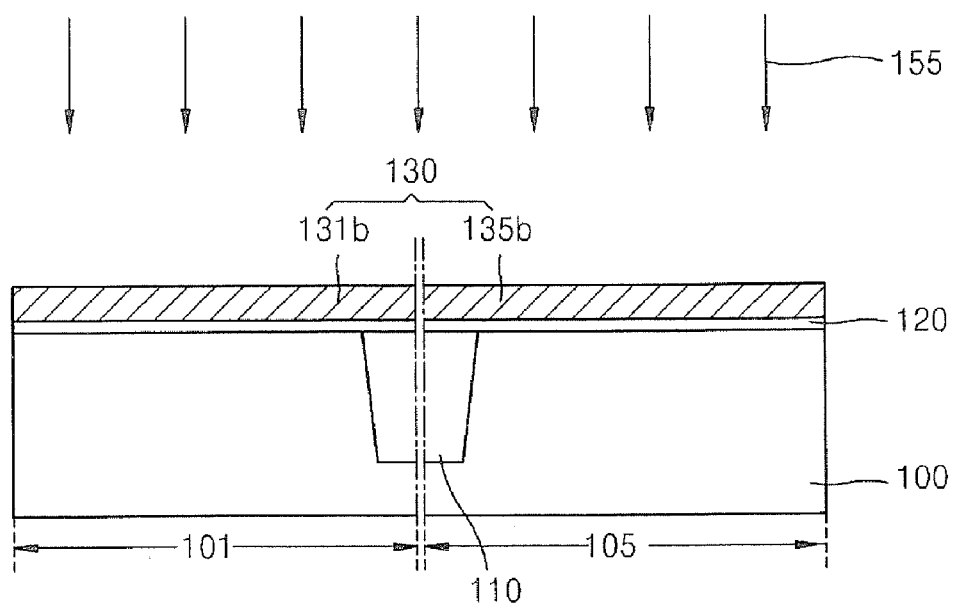

Referring to FIG. 1E, the diffusion layer 160 is removed so as to entirely expose the gate insulating layer 130. Referring to FIG. 1F, plasma nitridation is further performed to inject nitrogen 155 into the exposed gate insulating layer 130 in order to stabilize the gate insulating layer 130 having the high dielectric constant.

Figure 1G:
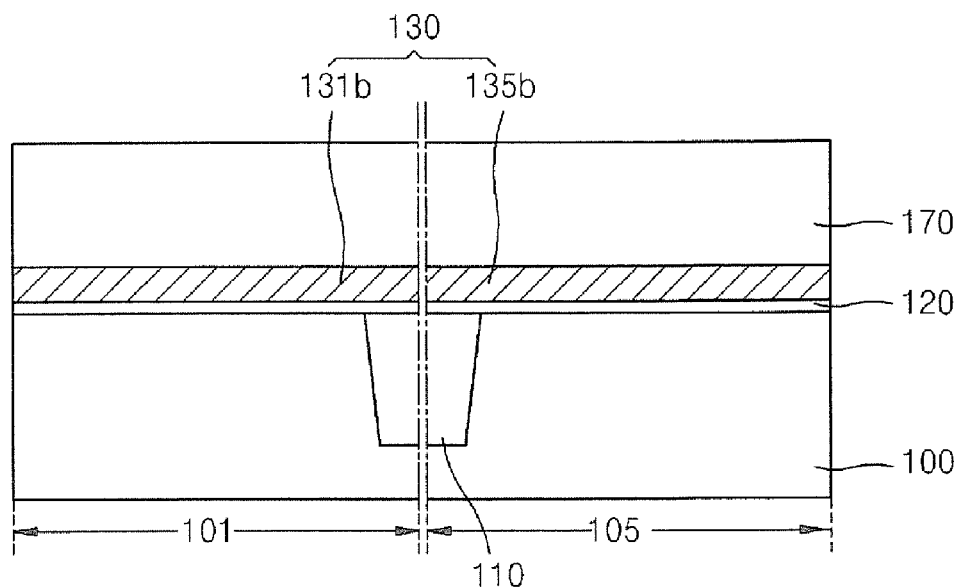

Referring to FIG. 1G, a gate electrode layer 170 is formed on the gate insulating layer 130 treated with the plasma nitridation. The gate electrode layer 170 may include metal. The gate electrode layer 170 may include one selected from a group consisting of TaN, TiN, TiAlN, and WN.

Figure 1H:
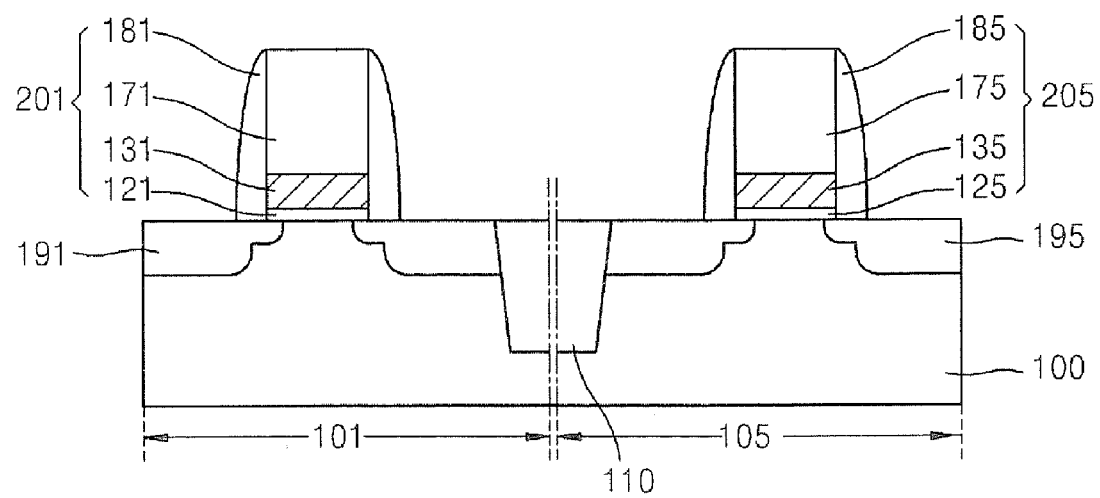

Referring to FIG. 1H, a first gate 171 including a first gate insulating layer 131 and a second gate 175 including a second gate insulating layer 135 are respectively formed in the PMOS region 101 and the NMOS region 105 by etching the interface layer 120, the gate insulating layer 130, and the gate electrode layer 170. A work function is reduced in the second gate 175 since aluminum or oxygen is diffused to the second gate insulating layer 135, thereby reducing a threshold voltage of the NMOS transistor.

A spacer material (not shown) may be deposited on the semiconductor substrate 100 including the first gate 171 and the second gate 175, and an etch back may be performed to respectively form a first gate spacer 181 and a second gate spacer 185 on side walls of the first gate 171 and the second gate 175. Thus, a first gate structure 201 of the PMOS transistor may be formed in the PMOS region 101, and a second gate structure 205 of the NMOS transistor may be formed in the NMOS region 105.

First impurity regions 191 for a source/a drain of the PMOS transistor may be formed on both sides of the first gate structure 201 of the PMOS region 101, and second impurity regions 195 for a source/a drain of the NMOS transistor may be formed on both sides of the second gate structure 205 of the NMOS region 105. The first impurity regions 191 and the second impurity regions 195 may have a lightly doped drain (LDD) structure.

Figure 2A:
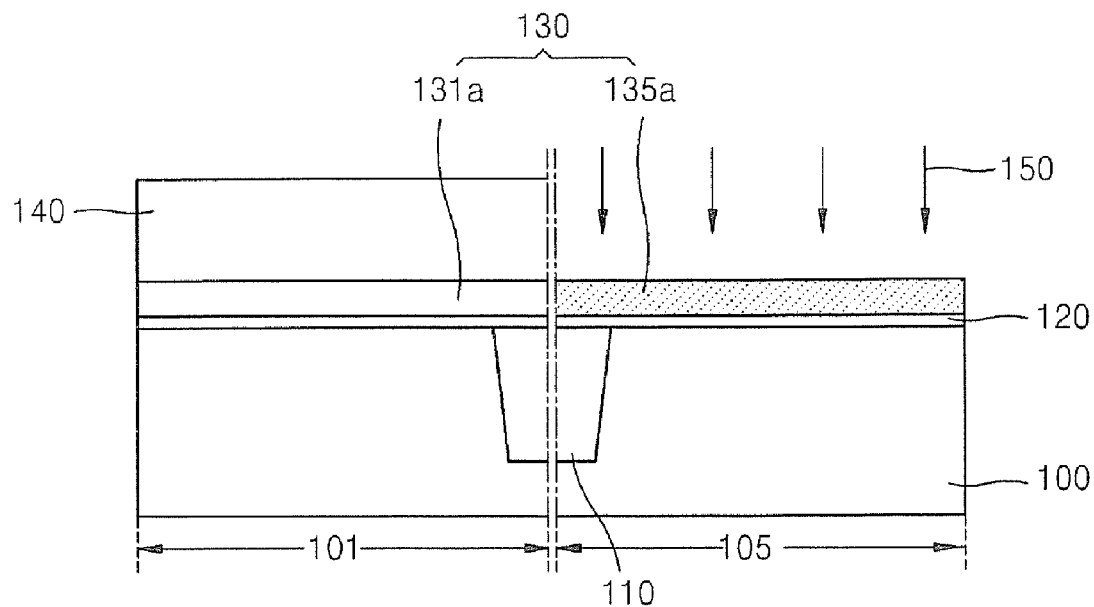
FIGS. 2A through 2C are cross-sectional views for illustrating a method of fabricating a semiconductor device, according to another embodiment of the inventive concept.
Figure 2B:
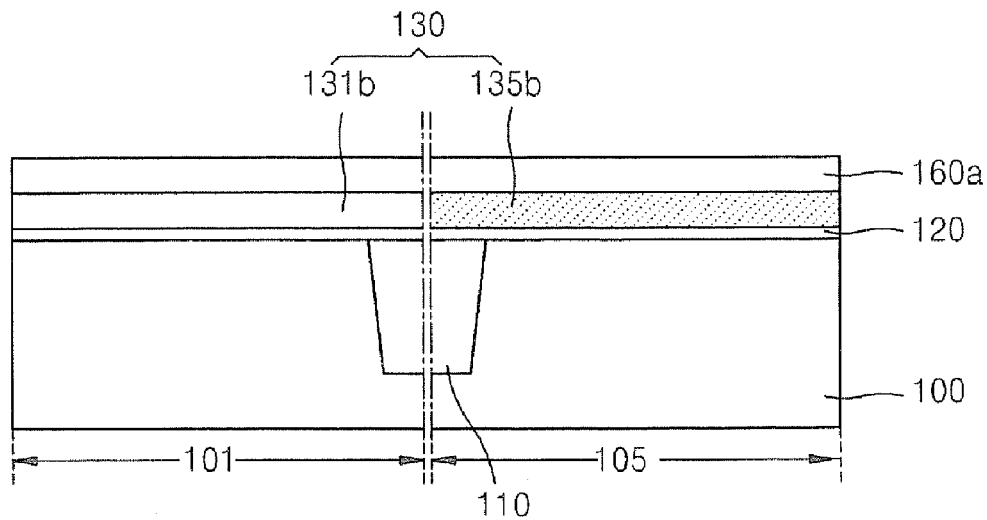
Figure 2C:
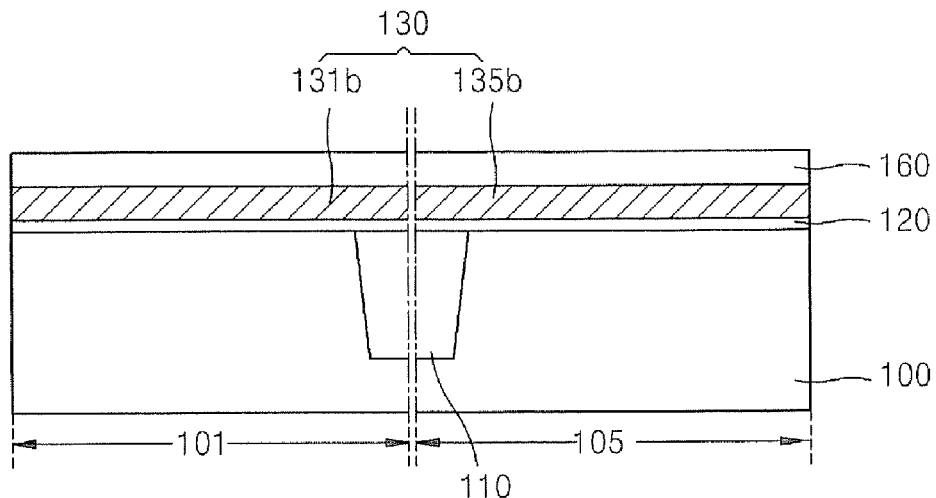

FIGS. 2A through 2C are cross-sectional views for describing a method of fabricating a semiconductor device, according to another embodiment. Since the method of fabricating the semiconductor device illustrated in FIGS. 2A to 2C is the same as the method illustrated in FIGS. 1A to 1H, except that the work function of the gate of the PMOS transistor is alternately controlled is different, a process of controlling the work function of the gate of the PMOS transistor according to FIGS. 2A to 2C will be described.

Referring to FIG. 2A, an interface layer 120 is formed on a semiconductor substrate 100 including a PMOS region 101 in which a PMOS transistor is arranged and an NMOS region 105 in which an NMOS transistor is arranged, wherein the PMOS region 101 and the NMOS region 105 are defined by an isolation film 110. A gate insulating layer 130 having a high dielectric constant is formed on the interface layer 120. The gate insulating layer 130 may include one selected from a group consisting of $HfSiO_2$, HfSiO, HSiON, HfON, HfAlO, HfLaO, and $La_2O_3$.

A photosensitive layer 140 is formed on the gate insulating layer 130. The photosensitive layer 140 is arranged on a first region 131a of the gate insulating layer 130 corresponding to the PMOS region 101 so as to expose a second region 135a of the gate insulating layer 130 corresponding to the NMOS region 105.

Nitrogen 150 is injected into the exposed second region 135a of the gate insulating layer 130 using the photosensitive layer 140 as a mask. The nitrogen 150 may be injected into the exposed second region 135a of the gate insulating layer 130 using plasma nitridation or an implant process. The nitrogen 150 may inhibit or block the work function controlling material from being diffused from a diffusion layer 160a of FIG. 2B to the second region 135a of the gate insulating layer 130.

Referring to FIG. 2B, the photosensitive layer 140 is removed. The diffusion layer 160a is formed on the gate insulating layer 130. The diffusion layer 160a may include AlO. The diffusion layer 160a controls or increases a work function of a gate of the PMOS transistor which will be formed in the PMOS region 101.

Referring to FIG. 2C, a heat treatment is performed. A work function controlling material, such as aluminum or oxygen, is diffused from the diffusion layer 160a to the gate insulating layer 130. The nitrogen 150 is injected into the second region 135b, as shown in FIG. 2B, may inhibit or block the work function controlling material from being diffused from the diffusion layer 160 to the second region 135b. Meanwhile, since the nitrogen 150 is not injected into the first region 131b, the work function controlling material is diffused from the diffusion layer 160a to the first region 131b.

Figure 3:
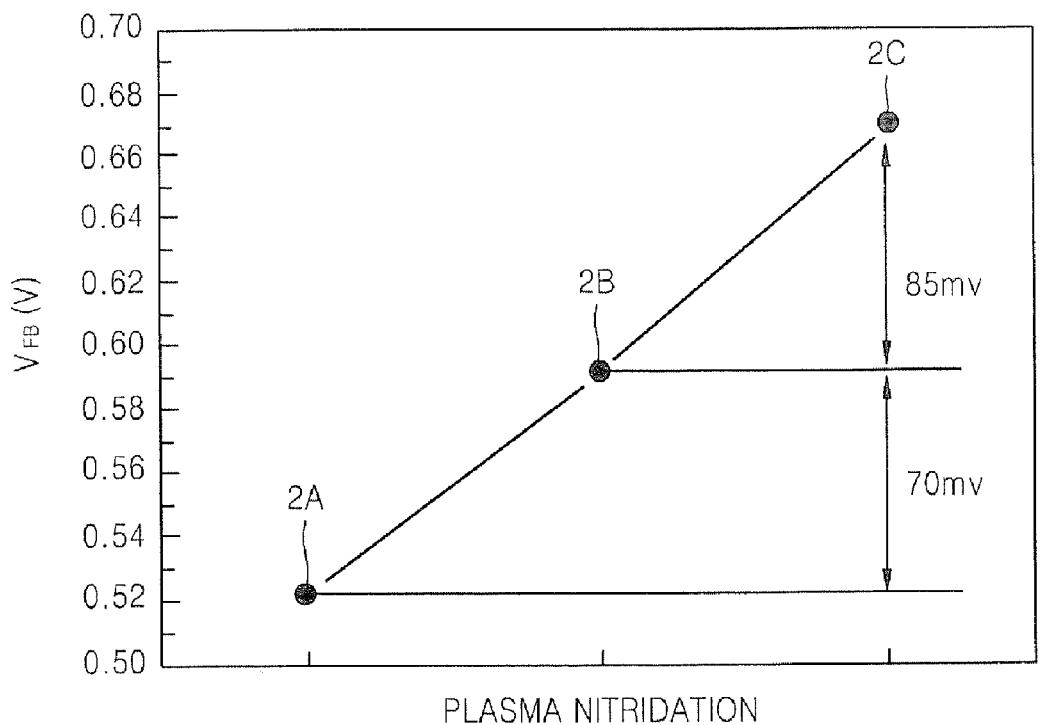
FIG. 3 is a graph illustrating capping effects based on plasma nitridation during a process for fabricating the semiconductor device.

FIG. 3 is a graph illustrating capping effects of inhibiting diffusion of a work function controlling material based on plasma nitridation during a method of fabricating the semiconductor device having a dual gate.

Referring to FIG. 3, a diffusion layer is formed of AlO, and a gate insulating layer is formed of HfSiO. A flat band voltage (Vfb) of a semiconductor device prepared by performing plasma nitridation before and after forming the diffusion layer of AlO and performing a heat treatment after forming the diffusion layer of AlO is shown as 2A. A flat band voltage (Vfb) of a semiconductor device prepared by performing plasma nitridation and a heat treatment after forming the diffusion layer of AlO is shown as 2B. A flat band voltage (Vfb) of a semiconductor device prepared by performing a heat treatment after forming the diffusion layer of AlO is shown as 2C. As a result, the flat band voltage difference between 2A and 2B is 70 mV, and the flat band voltage difference between 2A and 2C is 150 mV. Thus, if the plasma nitridation is performed before forming the diffusion layer of AlO, there is no significant capping effects on the work function controlling material.

While the inventive concept has been particularly shown and described with reference to exemplary embodiments thereof, it will be understood that various changes in form and details may be made therein without departing from the spirit and scope of the following claims.

What is claimed is:
1. A method of fabricating a semiconductor device having a dual gate, the method comprising:
forming a gate insulating layer on a semiconductor substrate comprising a first region and a second region, on which devices having different threshold voltages are to be formed;
selectively injecting a diffusion inhibiting material into the gate insulting layer in one of the first region and the second region;
forming a diffusion layer on the gate insulating layer;
directly diffusing a work function controlling material from the diffusion layer into the gate insulating layer using a heat treatment, wherein the gate insulating layer is self-aligned capped with the selectively injected diffusion inhibiting material so that the work function controlling material is diffused into the other of the first region and the second region;
entirely exposing the gate insulating layer by removing the diffusion layer;
forming a gate electrode layer on the exposed gate insulating layer; and respectively forming a first gate and a second gate having different work functions in the first region and the second region by etching the gate electrode layer and the gate insulating layer.

2. The method of claim 1, wherein the gate insulating layer comprises $HfSiO_2$, HfSiO, HfSiON, HfON, HfAlO, HfLaO, and/or $La_2O_3$.

3. The method of claim 2, wherein the diffusion layer comprises AlO, LaO, DyO, and/or YO.

4. The method of claim 1, wherein the injection of the diffusion inhibiting material is performed by injecting nitrogen into the one of the first region and the second region of the gate insulating layer using plasma nitridation or an implant process.

5. The method of claim 1, wherein the gate electrode layer comprises WN, TiN, TaN, and/or TiAlN.

6. The method of claim 1, wherein nitrogen is further injected into the exposed gate insulating layer by performing plasma nitridation before the forming gate electrode layer, after the removing the diffusion layer.

7. The method of claim 1, wherein a first gate formed in the first region comprises a gate of a PMOS transistor, a second gate formed in the second region comprises a gate of an NMOS transistor, and the injection of the diffusion inhibiting material comprises an injection of nitrogen into the second region.

8. The method of claim 7, wherein the diffusion layer comprises AlO.

9. The method of claim 1, wherein a first gate formed in the first region comprises a gate of a PMOS transistor, a second gate formed in the second region comprises a gate of an NMOS transistor, and the injection of the diffusion inhibiting material comprises an injection of nitrogen into the first region.

10. The method of claim 9, wherein the diffusion layer comprises LaO, DyO, and/or YO.

11. A method of forming a gate insulating layer and a dual gate in a semiconductor device, the method comprising:
 selectively injecting diffusion inhibiting material into a gate insulating layer in a first region thereof and avoiding injecting the diffusion inhibiting material into a second region of the gate insulating layer;
 forming a diffusion layer on the gate insulating layer;
 directly diffusing a work function controlling material from the diffusion layer into the second region and avoiding directly diffusing the work function controlling material into the first region;
 entirely exposing the gate insulating layer by removing the diffusion layer;
 forming a gate electrode layer on the exposed gate insulating layer; and
 respectively forming a first gate and a second gate having different work functions in the first region and the second region by etching the gate electrode layer and the gate insulating layer.

12. The method of claim 11, wherein the gate insulating layer comprises $HfSiO_2$, HfSiO, HfSiON, HfON, HfAlO, HfLaO, and/or $La_2O_3$.

13. The method of claim 11, wherein the diffusion layer comprises AlO, LaO, DyO, and/or YO.

14. The method of claim 11, wherein the injection of the diffusion inhibiting material is performed using plasma nitridation or an implant process.

15. The method of claim 11, wherein the gate electrode layer comprises WN, TiN, TaN, and/or TiAlN.

16. The method of claim 11, wherein nitrogen is further injected into the exposed gate insulating layer by performing plasma nitridation before the forming gate electrode layer, and after the removing the diffusion layer.

17. The method of claim 11, wherein a first gate formed in the first region comprises a gate of a PMOS transistor, a second gate formed in the second region comprises a gate of an NMOS transistor, and injecting the diffusion inhibiting material comprises injecting nitrogen into the second region.

18. The method of claim 11, wherein a first gate formed in the first region comprises a gate of a PMOS transistor, a second gate formed in the second region comprises a gate of an NMOS transistor, and injecting the diffusion inhibiting material comprises injecting nitrogen into the first region.

* * * * *